US007473947B2

(12) United States Patent
Murthy et al.

(10) Patent No.: US 7,473,947 B2
(45) Date of Patent: Jan. 6, 2009

(54) PROCESS FOR ULTRA-THIN BODY SOI DEVICES THAT INCORPORATE EPI SILICON TIPS AND ARTICLE MADE THEREBY

(75) Inventors: Anand Murthy, Portland, OR (US); Brian Doyle, Portland, OR (US); Jack Kavalieros, Portland, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 283 days.

(21) Appl. No.: 10/194,506

(22) Filed: Jul. 12, 2002

(65) Prior Publication Data

US 2004/0007724 A1 Jan. 15, 2004

(51) Int. Cl.
*H01L 21/00* (2006.01)

(52) U.S. Cl. ........................ 257/288; 257/347; 257/344

(58) Field of Classification Search ................. 438/311, 438/429, 312, 314, 318, 324, 327, 296, 424, 438/704, 268, 329, 336, 300; 257/347, 377, 257/401, 288, 344
See application file for complete search history.

(56) References Cited

U.S. PATENT DOCUMENTS 4,052,251 A 10/1977 Weitzel
4,876,213 A 10/1989 Pfiester
4,963,502 A * 10/1990 Teng et al. .................. 438/225
5,043,778 A * 8/1991 Teng et al. .................. 257/374
5,310,626 A * 5/1994 Fernandes et al. ........... 430/327
5,824,587 A * 10/1998 Krivokapic ................. 438/300
5,864,161 A * 1/1999 Mitani et al. ................ 257/347
5,869,359 A * 2/1999 Prabhakar ................... 438/149
5,915,164 A 6/1999 Taskar et al. .................. 438/47
6,037,627 A * 3/2000 Kitamura et al. ............ 257/324
6,060,403 A * 5/2000 Yasuda et al. ............... 438/765
6,071,783 A * 6/2000 Liang et al. ................. 438/301
6,261,911 B1 * 7/2001 Lee et al. .................... 438/300
6,368,927 B1 * 4/2002 Lee ............................ 438/300
6,403,433 B1 6/2002 Yu et al. ..................... 438/300
6,406,951 B1 6/2002 Yu ............................. 438/183
6,461,967 B2 * 10/2002 Wu et al. .................... 438/705
6,521,949 B2 * 2/2003 Assaderaghi et al. ........ 257/347
6,548,364 B2 * 4/2003 Hsu ........................... 438/311
6,559,011 B1 * 5/2003 Shibib ........................ 438/268
6,573,571 B2 6/2003 Li
6,642,133 B2 * 11/2003 Roberds et al. ............. 438/595
6,696,345 B2 * 2/2004 Chau et al. .................. 438/387
6,724,009 B2 * 4/2004 Cerofolini et al. ............. 257/40
6,774,000 B2 * 8/2004 Natzle et al. ................ 438/300

(Continued)

OTHER PUBLICATIONS

International Preliminary Examination Report (IPER) PCT/US03/21131.

(Continued)

*Primary Examiner*—Laura M Menz
(74) *Attorney, Agent, or Firm*—Blakely, Sokoloff, Taylor & Zafman LLP

(57) ABSTRACT

The invention relates to a transistor that includes an ultra-thin body epitaxial layer that forms an embedded junction with a channel that has a length dictated by an undercut under the gate stack for the transistor. The invention also relates to a process of forming the transistor and to a system that incorporates the transistor.

11 Claims, 8 Drawing Sheets

U.S. PATENT DOCUMENTS

| | | | | |
|---|---|---|---|---|
| 6,784,076 | B2 * | 8/2004 | Gonzalez et al. | 438/426 |
| 6,858,903 | B2 * | 2/2005 | Natzle et al. | 257/368 |
| 6,909,145 | B2 * | 6/2005 | Cabral et al. | 257/336 |
| 6,933,577 | B2 * | 8/2005 | Cabral et al. | 257/384 |
| 6,949,482 | B2 * | 9/2005 | Murthy et al. | 438/739 |
| 6,998,686 | B2 * | 2/2006 | Chau et al. | 257/407 |
| 7,045,407 | B2 * | 5/2006 | Keating et al. | 438/198 |
| 7,274,055 | B2 * | 9/2007 | Murthy et al. | 257/288 |
| 2003/0129793 | A1 * | 7/2003 | Chau et al. | 438/200 |
| 2003/0129795 | A1 * | 7/2003 | Chau et al. | 438/200 |
| 2004/0007724 | A1 * | 1/2004 | Murthy et al. | 257/288 |
| 2004/0248368 | A1 * | 12/2004 | Natzle et al. | 438/300 |
| 2005/0087824 | A1 | 4/2005 | Cabral, Jr. et al. | |
| 2005/0130454 | A1 | 6/2005 | Murthy et al. | |
| 2005/0253200 | A1 | 11/2005 | Murthy et al. | |
| 2005/0272187 | A1 * | 12/2005 | Murthy et al. | 438/151 |
| 2006/0017122 | A1 * | 1/2006 | Chau et al. | 257/413 |
| 2006/0131665 | A1 | 6/2006 | Murthy et al. | |
| 2006/0172497 | A1 * | 8/2006 | Hareland et al. | 438/286 |
| 2006/0186484 | A1 * | 8/2006 | Chau et al. | 257/401 |
| 2006/0252191 | A1 | 11/2006 | Kammler et al. | |
| 2006/0286755 | A1 * | 12/2006 | Brask et al. | 438/299 |

OTHER PUBLICATIONS

Wolf, Stanley et al., "Silicon Processing for the VLSI Era," vol. 1: Process Technology, Second Edition, Chapter 7, "Silicon Epitaxial Growth and Silicon on Insulator," (2000), p. 225, Lattice Press.

Murthy, Anand, et al., U.S. Appl. No. 11/204,418; *Office Action* mailed Dec. 12, 2006; 13 pages.

Murthy, Anand, et al., U.S. Appl. No. 11/204,418; *Office Action* mailed Jul. 26, 2007; 14 pages.

Murthy, Anand et al., U.S. Appl. No. 11/204,418, *Advisory Action* mailed Oct. 22, 2007, 2 pages.

Murthy, Anand et al., U.S. Appl. No. 11/204,418, *Office Action* mailed Dec. 31, 2007, 6 pages.

Murthy, Anand et al., U.S. Appl. No. 11/204,418, *Office Action* mailed Apr. 1, 2008, 6 pages.

* cited by examiner

PROCESS FOR ULTRA-THIN BODY SOI DEVICES THAT INCORPORATE EPI SILICON TIPS AND ARTICLE MADE THEREBY

FIELD OF THE INVENTION

An embodiment of the present invention relates generally to integrated circuit fabrication. More particularly, an embodiment of the present invention relates to a method of fabricating an ultra-thin body silicon on oxide (SOI) device.

BACKGROUND OF THE INVENTION

Description of Related Art

Transistor technology has progressed to include large-scale integration (LSI), very large-scale integration (VLSI), and ultra large-scale integration (ULSI), with further improvements appearing on the technical horizon. One challenge for ULSI is that more transistors must be incorporated into an integrated circuit (IC), while attempting to decrease the overall size of the semiconductive substrate. One requirement is that the semiconductive channel length is preferably shortened in order to further assist the miniaturization process. One challenge is that photolithographic techniques cause a critical dimension to be the smallest feature patternable. For example, the width of a gate stack may be such a critical dimension. Other challenges include proper electrical isolation between adjacent devices in the face of the relentless pressure to crowd devices closer to each other.

BRIEF DESCRIPTION OF THE DRAWINGS

In order to illustrate the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

Figure 1:
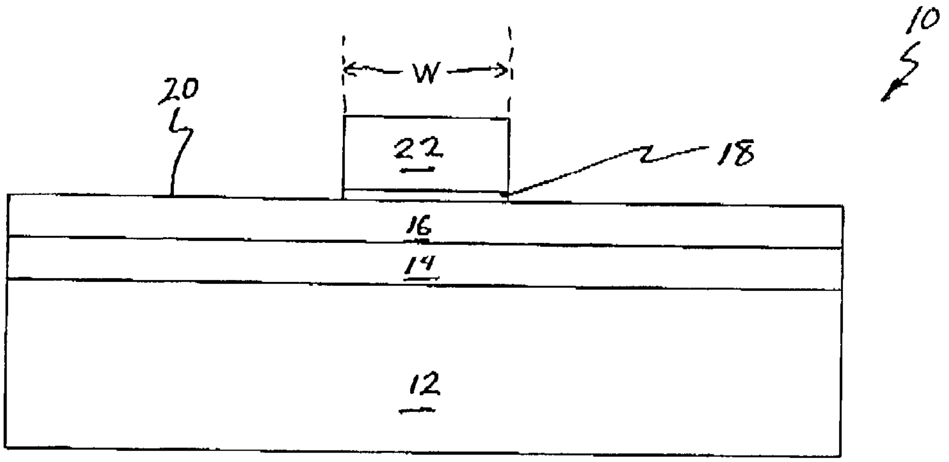
FIG. 1 is an elevational cross-section of a semiconductor structure that reveals a gate stack precursor according to an embodiment of the invention.

The present invention relates a process flow that forms an ultra-thin body silicon-on-insulator (SOI) transistor. FIG. 1 is an elevational cross section that illustrates a semiconductor device 10 during fabrication. Semiconductor device 10 includes a substrate 12 that by way of non-limiting example, is a p-type metal oxide semiconductor device (PMOS) or an n-type metal oxide semiconductor device (NMOS). According to the present invention, one embodiment of substrate 12 includes an SOI configuration. Accordingly, substrate 12 has an SOI insulator layer 14, and an SOI silicon layer 16. The formation of the SOI configuration is carried out according to known technique. Although an SOI configuration is depicted, other isolation structures may be added such as local isolation of silicon (LOCOS), recessed LOCOS, or shallow trench isolation (STI).

A gate dielectric layer 18 is formed on the upper surface 20 of substrate 12 as shown in FIG. 1. In one embodiment, gate dielectric layer 18 is a nitride oxide layer that is formed to a thickness in a range from about 5 Å to about 30 Å. In one embodiment, gate dielectric layer 18 is a nitrided oxide layer that has a thickness of about 8 Å. In other embodiments, gate dielectric layers such as oxides, nitrides, high-k materials, and combinations thereof are formed. A gate electrode 22 is formed on gate dielectric layer 18. In one embodiment, gate electrode 22 is formed in a thickness range from about 1,000 Å to about 3,500 Å that is blanket deposited, doped polysilicon. Doping may be in situ or it may follow patterning of the blanket depositing that results in gate electrode 22 with photolithographic techniques known in the art. It is to be appreciated that other well known patterning techniques may be utilized to pattern the blanket-deposited polysilicon layer into gate electrode 22 including submicron lithography techniques, such as e-beam and x-ray, and subphotolithographic patterning techniques known in the art. According to one process flow of the present invention gate electrode 22 has a width, W, in a lower range from about 100 nanometers (nm) to about 50 nm. Additionally, although gate electrode 22 is represented as a polysilicon electrode, other embodiments of gate electrode 22 can be but is not limited to a metal gate, a single crystalline silicon gate, or combinations thereof.

Figure 2:
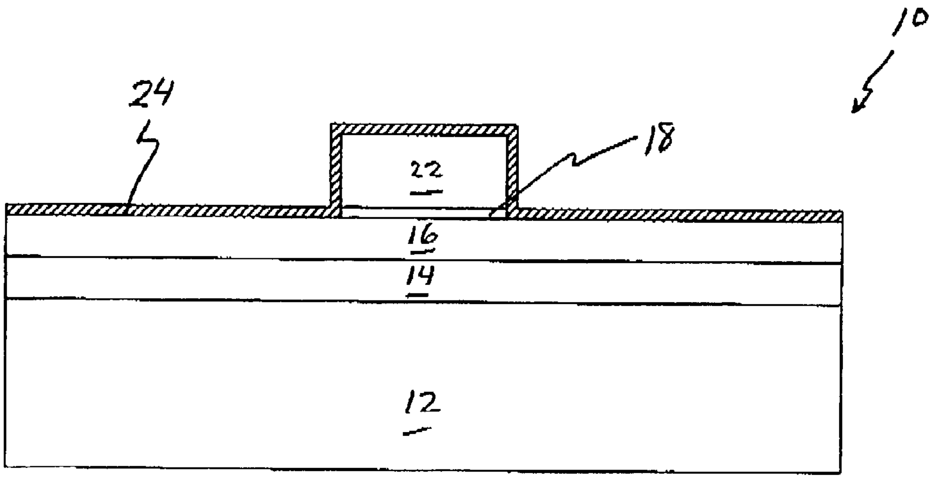
FIG. 2 is an elevational cross-section of the semiconductor structure depicted in FIG. 1 after further processing.

FIG. 2 illustrates further processing. A spacer first layer 24 is formed over substrate 12 including oxide gate dielectric layer 18 and the top and sides of gate electrode 22. In one embodiment, a spacer first layer 24 is formed to a thickness in a range from about 50 Å to about 300 Å. Spacer first layer 24 is preferably formed thick enough to electrically isolate a subsequently deposited semiconductive film from gate electrode 22. In one embodiment, spacer first layer 24 is an oxide film that is formed by what is commonly referred to as a hotwall process to achieve a hermetic seal of gate electrode 22 and the edges of gate dielectric 18. By forming an oxide spacer first layer 24 directly on gate electrode 22 a hermetic seal is formed and hot electron lifetime of the fabricated transistors is extended.

Figure 3:
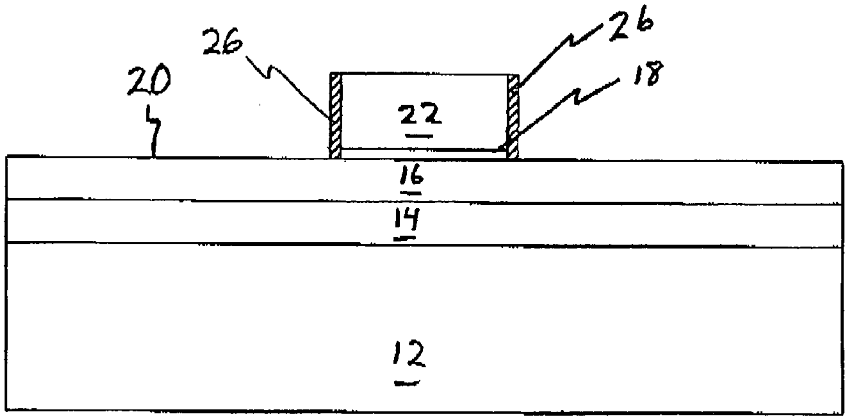
FIG. 3 is an elevational cross-section of the semiconductor structure depicted in FIG. 2 after further processing.

In one embodiment, spacer first layer 24 is spacer etched to form sidewall spacers for the MOS device. As depicted in FIG. 3, the spacer layer has been anisotropically dry etched to form a sidewall first spacer 26 which runs along laterally opposite sidewalls of gate electrode 22.

Figure 4:
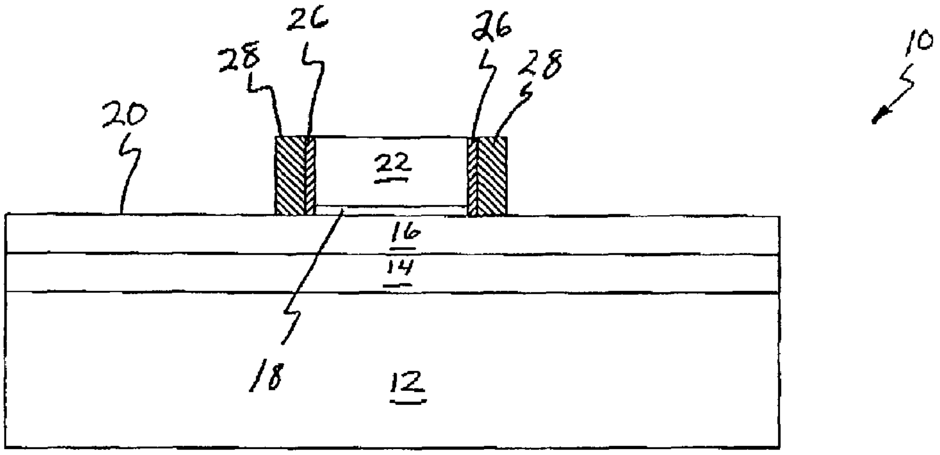
FIG. 4 is an elevational cross-section of the semiconductor structure depicted in FIG. 3 after further processing.

After the formation of an oxide sidewall first spacer 26, a nitride sidewall second spacer 28 is formed under a similar process flow. A nitride layer is blanket deposited over gate electrode 22 and sidewall first spacer 26 as depicted in FIG. 4. Thereafter, an anisotropic spacer etch follows. According to an embodiment, a silicon nitride layer is blanket deposited by a low pressure chemical vapor deposition (LPCVD) process by reacting ammonia ($NH_3$) and dichlorosilane (DCS) at a pressure in a range from about 25 milliTorr (mTorr) to about 100 mTorr, and at a temperature in a range from about 60° C. to about 100° C. In one specific embodiment, the $NH_3$ and DCS are deposited at about 75 mTorr and about 80° C.

Although a silicon nitride layer is hot-wall deposited in one embodiment, because of the hermetic seal that forms, any other suitable insulating layer, such as a deposited oxide or a composite oxide/silicon nitride film, can be used if a specific application is selected. According to an embodiment, nitride second spacer 28 is formed by anisotropically plasma etching the silicon nitride spacer layer using chemistry including $C_2F_6$ and a power in a range from about 100 watts to about 300 watts. In one embodiment, a power of about 200 watts is applied. The anisotropic etch is continued until all of the material has been removed from the upper surface 20 and from the top of gate electrode 22. The final thickness of first spacer 26 and second spacer 28 may each be in a range from about 50 Å to about 300 Å. In one embodiment, the thickness of first spacer 26 is in a range from about 50 Å to about 300 Å; second spacer 28 is at least as thick or thicker.

In an alternative embodiment, both the oxide first spacer layer and the nitride second spacer layer are deposited, and a composite spacer etch recipe is carried out that forms second spacer 28, followed by first spacer 26. In this process flow, the spacer etch that forms second spacer 28 need not have selectivity to the silicon of gate electrode 22 or to SOI silicon 16. However, selectivity to the spacer first layer is preferred if selectivity to silicon is not present. Accordingly, a single deposition tool may be utilized to form spacer first- and second layers in situ, and a single etch tool may be utilized to form second spacer 28, followed by first spacer 26, likewise in situ.

After the spacer etch(es) the structure can be cleaned by an HF clean according to conventional technique. In one embodiment, the HF clean is carried out for about 2 minutes. In one embodiment, the HF clean is followed by a hydrogen bake at a temperature of about 900° C. for about 2 minutes. The hydrogen bake can remove surface oxidation.

Although first spacer 26 is represented as an oxide and second spacer 28 is represented as a nitride, it is understood that other combination embodiments are contemplated. For example, combinations include an oxide first spacer and a nitride second spacer, a nitride first spacer and an oxide second spacer, an oxide first spacer and an oxide second spacer, and a nitride first spacer and a nitride second spacer. In each embodiment, an etch selectivity differentiation is an alternative characteristic, where the first spacer layer and the second spacer layer may be retained in other regions of the substrate as protection until processing in these regions is undertaken.

Figure 5:
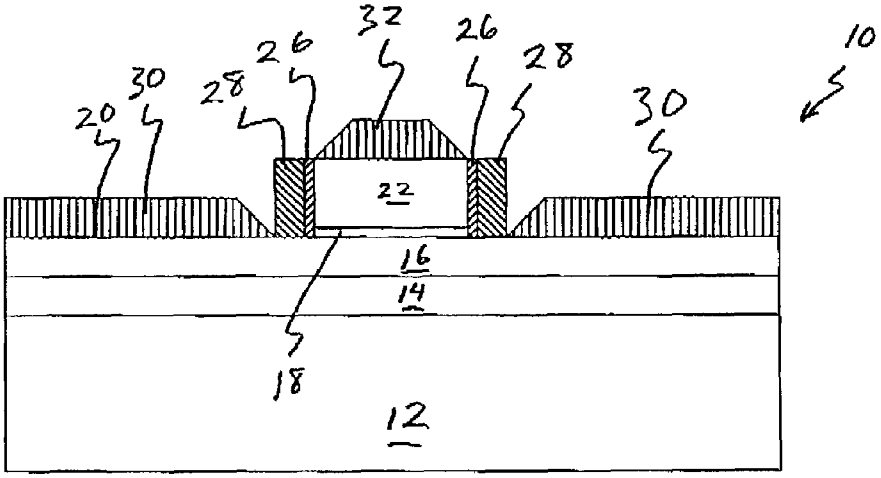
FIG. 5 is an elevational cross-section of the semiconductor structure depicted in FIG. 4 after further processing.

FIG. 5 illustrates further processing. After the formation of first spacer 26 and second spacer 28, an elevated silicon first layer 30 is formed upon upper surface 20 of substrate 12. The same process flow also forms an elevated polysilicon first layer 32 and above and on the gate electrode 22. Upper surface 20 includes SOI silicon 16 that acts as a crystal lattice seed layer to enable epitaxial monocrystalline growth that follows the crystal lattice of SOI silicon 16. In one embodiment, SOI silicon 16 is in a range from about 50 Å to about 400 Å. In one embodiment, silicon first layer 30 and polysilicon first layer 32 are substantially undoped, as they are often entirely removed according to selected embodiments. However, doping thereof may be done where the doping will assist process integration. In the formation of silicon first layer 30 and polysilicon first layer 32, a silicon or silicon alloy film is selectively deposited onto upper surface 20 and onto the exposed silicon of gate electrode 22. Selective deposition of silicon forms silicon only on silicon containing surfaces. The deposited silicon can be a silicon film of substantially only silicon or it can be a silicon alloy such a silicon germanium. A silicon film can be selectively deposited by heating to a temperature of 600-900° C. and providing a deposition gas such as dichlorosilane silane ($SiH_2Cl_2$) and Hydrogen ($H_2$). A silicon germanium alloy ($Si_{1-x}Ge_x$) can be selectively deposited by heating to a temperature between 700-750° C. and providing a deposition gas such as dichlorosilane at a rate of between 10-300 sccm, 1% hydrogen diluted germane ($GeH_4$) at a rate of between 10-200 sccm, and $H_2$ at a rate of about 20 slm into a CVD chamber that is maintained at a pressure between 10-760 torr. A dopant gas such as diborane, phosphine, and arsine can be included in the process gas mix if a doped silicon or silicon alloy film is desired.

Figure 6:
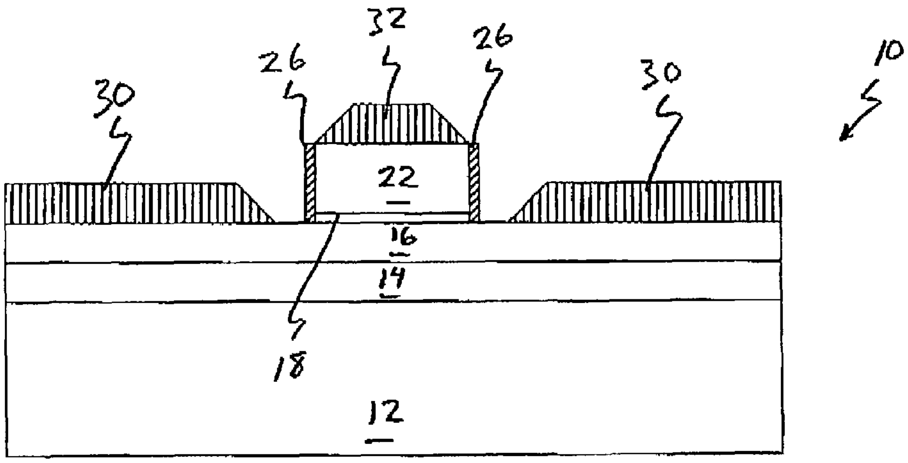
FIG. 6 is an elevational cross-section of the semiconductor structure depicted in FIG. 5 after further processing.
Figure 7:
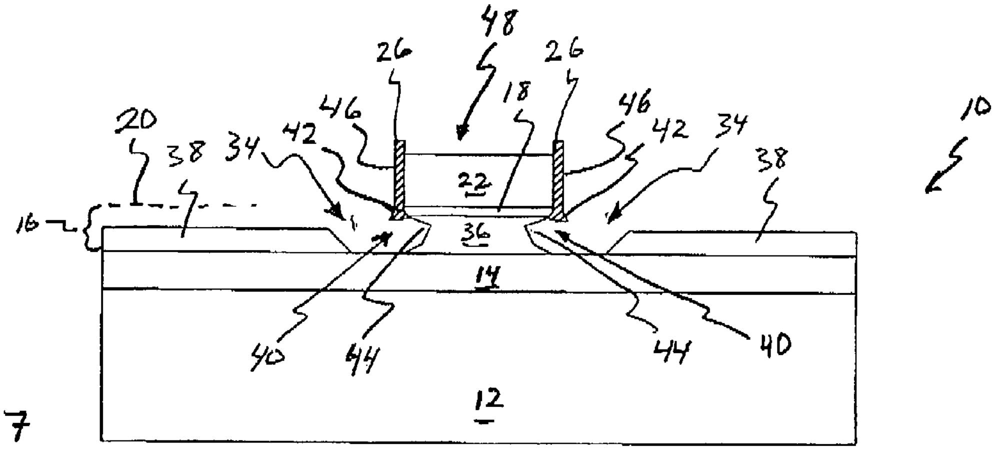
FIG. 7 is an elevational cross-section of the semiconductor structure depicted in FIG. 6 after further processing.

FIG. 6 illustrates further processing and second spacer 28 has been stripped such as by a wet etch that is selective to first spacer 26 and to exposed silicon. Thereafter, a semi-iosotropic dry etch is carried out to form a self-aligned recess 34 as depicted in FIG. 7. Self-aligned recess 34 forms in what remains of the SOI silicon 16, aligned along laterally opposite sidewalls of gate electrode 18. In one embodiment, a semi-isotropic etch process flow is used to form self-aligned recess 34. An isotropic etch not only etches vertically into the SOI silicon layer 16 (FIG. 6), but it also etches horizontally beneath first spacer 26 and gate electrode 22. The semi-isotropic etch of the SOI silicon forms a gate-masked residue 36 of the SOI silicon 16 and a lateral residue 38 thereof. The etch also forms an undercut 40. Accordingly the transistor channel length, which is measured by gate-masked residue 36 of SOI silicon 16, may be shorter than width, W.

In one embodiment, undercut etching is produced by using a semi-isotropic dry etch process in a parallel plate radio frequency (RF) plasma etching system. A wet etch may also be used to form self-aligned recess 34 and undercut 40. In the semi-isotropic dry etch, the chemistry includes a gas mix chemistry of sulfur hexafluoride ($SF_6$) and helium (He) and process conditions which favor isotropy. Such conditions include a low enough pressure to allow the mean-free path of an etchant gas to start approaching anisotropy, but to retain basically isotropic performance that will also achieve the undercut 40 beneath gate electrode 22 and gate dielectric layer 18. Additionally a low RF power density is selected. In one embodiment of the present invention, a process pressure of about 900 mTorr, a gap of about 1.1 cm, an RF power of about 100 W, a He flow of about 150 sccm, and an $SF_6$ flow of about 100 sccm is used. In this embodiment, the RF power is varied in a range from about 50 W to about 200 W, and the process pressure is varied at ranges above about 500 mTorr.

According to the present invention, the semi-isotropic dry etch process flow produces undercut 40 and the etch chemistry is also selective to the gate dielectric layer 18, the SOI insulator layer 14, and the first spacer 26. In this way first spacer 26 and gate dielectric layer 18 are not significantly etched during the silicon etch. In one embodiment of the etch process flow that is used to form the undercut 40, the etch chemistry is slightly oxidizing such that the etch conditions cause a lateral portion 42 of the gate dielectric layer 18 or first spacer 26 that is exposed during the recess etch to thicken. Thereby, the gate edge leakage at the tip overlap region of the gate stack is reduced. A thicker gate dielectric layer at the gate edge also increases the breakdown voltage of the gate.

Because an over-etch would undercut the gate electrode 22 in SOI silicon layer 16 and continue to reduce gate-masked residue 36 until it would be destroyed, the lateral recess etch process flow of the present invention acts to control the lateral etch rate to between about 1 Å/second to about 30 Å/second. In one embodiment, the controlled lateral etch rate causes an inflection point 44 to form in what is left of the SOI silicon layer 16 as depicted in FIG. 7. According to the present invention, the transistor channel length is definable approximately from the inflection point 44 to the opposite inflection point 44. Hence, where the minimum feature is a gate width, W (FIG. 1), a channel length is less than width W. With this geometry, a large $L_{MET}$ (metallurgical channel length or physical channel length) is achieved during the off state of the transistor (low $I_{off}$) while a smaller $L_{MET}$ is achieved during the on state when the channel is formed. A smaller $L_{MET}$ during the on state causes a smaller channel resistance and enhances a higher $I_{on}$. In one embodiment, the gate dielectric has a width, W, and the $L_{MET}$ has a length that is in a range from about 0.2W to about 0.99W. In another embodiment, the gate dielectric has a width, W, and the $L_{MET}$ has a length that is in a range from about 0.3W to about 0.8W. In another embodiment, the gate dielectric has a width, W, and the $L_{MET}$ has a length that is in a range from about 0.4W to about 0.7W.

Where the minimum feature, such as W by way of non-limiting example, is based upon a commonly referred-to metric, such as a 0.25 micrometer (micron) process, it is understood that the actual measurement may vary from 0.25 actual microns. By way of further reference, according to design rules, a minimum feature may be part of the metric of device 10 depicted in the figures. For example, photolithography process flows may have minimum features that are 0.25 microns, 0.18 microns, and 0.13 microns. It is understood that the various metrics such as 0.25 microns may have distinctly different dimensions in one business entity from a comparative business entity. Accordingly, such metrics, although quantitatively called out, may differ between a given two business entities. Other minimum features that may be accomplished in the future are applicable to the present invention.

In an embodiment of the present invention self-aligned recess 34 has a maximum vertical depth the stops on the SOI insulator layer 14 due to etch selectivity. In this embodiment, self-aligned recess 34 is between about 100 Å and about 1,500 Å below the former location of upper surface 20 and extends between about 25 Å to about 200 Å horizontally or laterally beneath the edge 46 of the gate stack 48. The deepest penetration into the SOI silicon layer 16 occurs at the inflection point 44 if present. It is to be appreciated that alternative process conditions and etch chemistries may be elected to generate other recess geometry profiles of undercut 40. The semi-isotropic dry etch substantially removes the epitaxial first film 30 (FIG. 6) and the polysilicon first film 32 (FIG. 6) and begins to etch into the SOI silicon layer 16 and the polysilicon of gate electrode 22.

Figure 8:
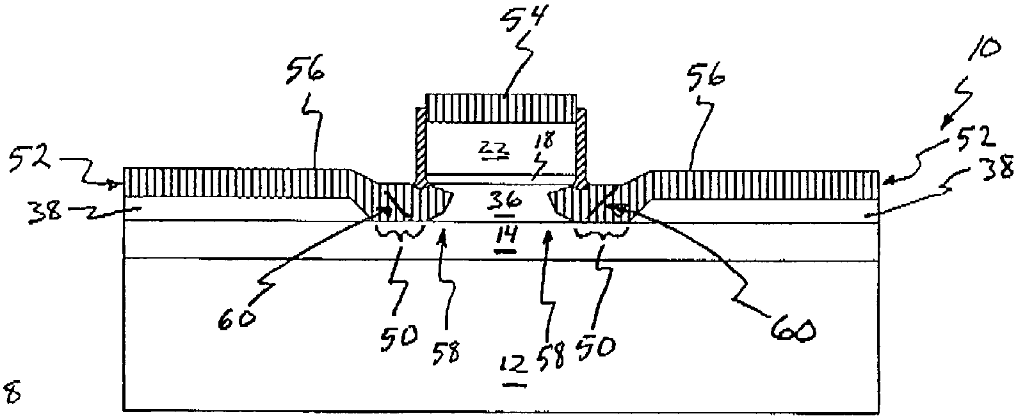
FIG. 8 is an elevational cross-section of the semiconductor structure depicted in FIG. 7 after further processing.

After the etch, it is noted that there is exposed a self-aligned portion 50 of SOI insulator layer 14 as depicted in FIG. 8. According to an embodiment, an ultra-thin body epitaxial second layer 52 and a polysilicon second layer 54 are formed. Epitaxial second layer 52 includes a raised epitaxial tip 56 that may or may not be at a level that is higher than the original placement of the upper surface 20 of the original SOI silicon 16. Further, raised epitaxial tip 56 may approach the same height as gate stack 48 according to given applications. In one embodiment, raised epitaxial tip 56 is up to about 10% as high as gate stack 48, when measured from upper surface 20. In one embodiment, raised epitaxial tip 56 is up to about 50% as high as gate stack 48, when measured from upper surface 20. In one embodiment, raised epitaxial tip 56 is up to about 90% as high as gate stack 48, when measured from upper surface 20. The height of gate stack 48, for these purposes includes any conductive material of the finished device.

Epitaxial second layer 52 also includes an embedded source/drain junction 58 with gate-masked residue 36. Epitaxial second layer 52 takes as it seed sources, gate-masked residue 36 of SOI silicon layer 16 and lateral residue 38 thereof.

Process conditions cause the epitaxial second layer 52 to form a closure seam 60 somewhere between the gate-masked residue 36 of SOI silicon layer 16 and lateral residue 38 thereof. Closure seam 60 is depicted in an arbitrary location and at an arbitrary angle and shape, but it is to be understood that in one embodiment, it has the appearance of a dislocation in an otherwise substantially epitaxial and monocrystalline layer 52. Closure seam 60 may be formed at an angle that minimizes increased resistivity as electrical current flows from raised tip 56 and through embedded junction 58.

Again, it is noted that above gate electrode 22, an ultra-thin body polysilicon second layer 54 simultaneously forms during the formation of epitaxial second layer 52. In one embodiment, a film of boron-doped silicon is formed using $SiH_2Cl_2$ based chemistry such that the deposition is highly selective to the spacer 26, such that the boron-doped silicon does not form on, or adhere to the spacer 26. However, the recesses are substantially filled by this deposition process. The recess can be completely filled by this process.

In an alternative embodiment, boron-doped SiGe can be used in place of boron-doped silicon to form the film that fills the recess. Typically, epitaxial material is deposited such that its top surface is above the plane of the original surface of the substrate.

In one embodiment, a boron-doped silicon film is formed by a selective deposition. A selective deposition of silicon, or a silicon alloy such as silicon germanium, forms silicon, or the silicon alloy, or the exposed silicon surfaces. For example, a selective deposition of boron-doped silicon creates the ultra-thin body second layers 52, 54. Such a film can be selective deposited by heating the substrate to a temperature from about 600° to about 900° C. and metering a deposition gas such as dichlorosilane and hydrogen. Similarly, a silicon germanium alloy can be selectively deposited by heating to a temperature between about 700° C. and about 750° C., providing a deposition gas mix of dichlorosilane at a rate from about 10 sccm to about 300 sccm, 1% hydrogen-diluted germane gas at a rate from about 10 sccm to about 25 sccm, and hydrogen from about 15 slm to about 25 slm into a CVD chamber that is maintained at a pressure from about 50 torr to about 760 torr, or ambient pressure. A dopant gas such as diborane, phosphine, or arsine, can be included in the process gas mixture if a doped silicon or silicon alloy film is to be formed.

A highly doped (>$5\times10^{20}$ atoms/$cm^2$) n-type silicon germanium epitaxial film can be selectively deposited onto silicon surfaces by thermal chemical vapor deposition utilizing a deposition gas mix including germane, dichlorosilane, arsine, and hydrogen while maintaining the substrate at a temperature between about 700° C. and about 750° C. and maintaining a relatively high deposition pressure of greater than about 50 torr but less than atmospheric during film deposition. Such a process will form a substantially uniformly doped n-type silicon germanium epitaxial film.

Similarly, a p-type silicon germanium alloy can be formed by decomposition of approximately 20 sccm of dichlorosilane, approximately 130 to 180 sccm of 1% hydrogen-diluted germanium, and a p-type dopant source, such as approximately 5-50 sccm of 1% hydrogen-diluted diborane ($B_2H_6$) at a temperature between approximately 600° C. and 800° C. In one embodiment, a temperature of about 700° C. and a relatively high pressure of about 50 torr is used. In order to decrease the selectivity of the decomposition process, approximately 25 to 50 sccm of HCl can be added to the gas deposition mixture.

Those skilled in the art and having the benefit of this disclosure, will recognize that, the deposition process is such that selectivity to oxide in field oxide regions, or shallow trench isolation regions is also achieved.

Figure 9:
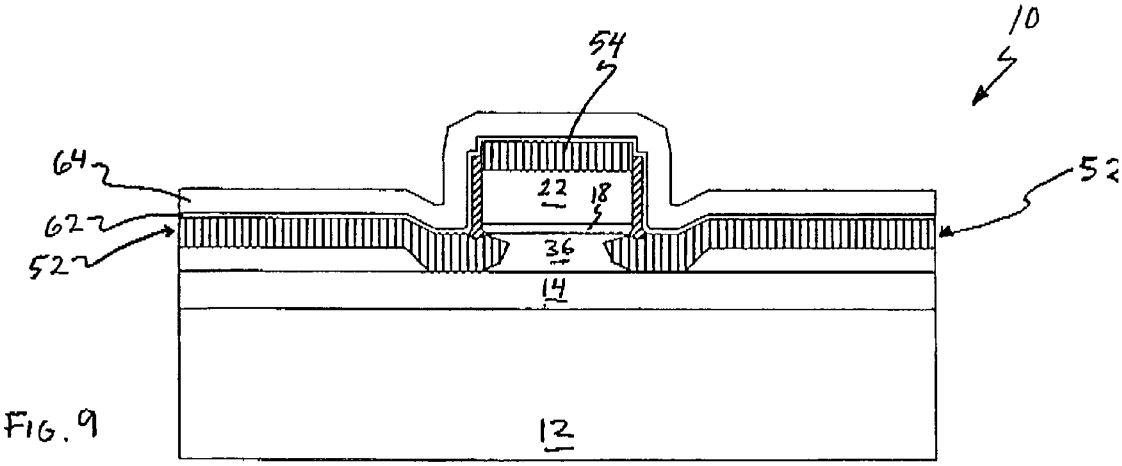
FIG. 9 is an elevational cross-section of the semiconductor structure depicted in FIG. 8 after further processing.

Further processing is carried out to protect the achieved structures and to prepare them for metallization connection. Raised episilicon tip 56 is further processed to increase the conductivity of the device. As depicted in FIG. 9, a first dielectric layer 62 is formed over substrate 12 by CVD. First dielectric layer 62 may be selected from an oxide, a nitride, an oxynitride, and the like. In one embodiment, first dielectric layer 62 has thickness in a range from about 50 Å to about 100 Å. Thereafter a second dielectric layer 64 is formed over substrate 12 by CVD. Second dielectric layer 64 may be selected from an oxide, a nitride, an oxynitride, and the like, so long as it has at least one of a significant oxidation- or etch response difference from first dielectric layer 62. In one embodiment, second dielectric layer 64 has a thickness in a range from about 500 Å to about 1,800 Å. The formation of both first and second dielectric layers 62, 64 are preferably carried out at temperatures that conserve the thermal budget.

Figure 10:
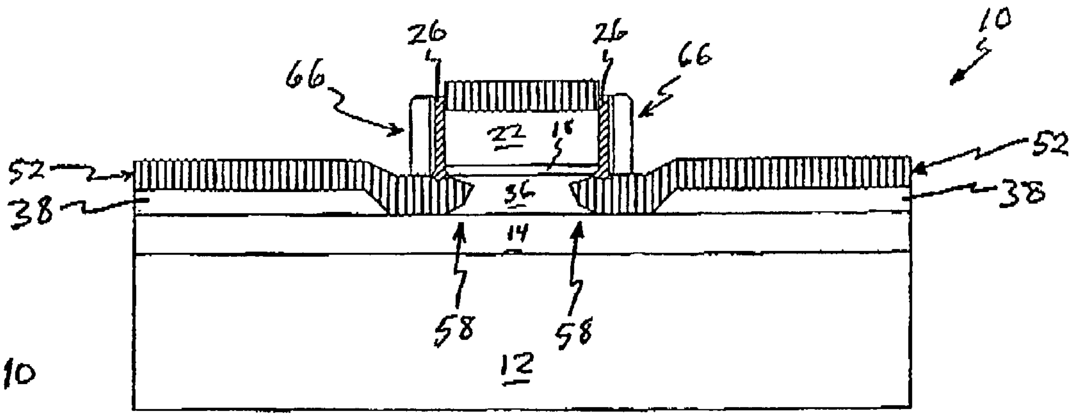
FIG. 10 is an elevational cross-section of the semiconductor structure depicted in FIG. 9 after further processing.

After the formation of first- and second dielectric layers 62 and 64, respectively, a spacer etch is carried out to form a composite spacer 66 adjacent to sidewall first spacer 26 as depicted in FIG. 10. Because first- and second dielectric layers 62 and 64, respectively, may be a first oxide and a second nitride material, silicon nitride and oxide etch process may be used. In another embodiment, the functional equivalent of composite spacer 66 may be formed from a single nitride or oxide dielectric. In one embodiment, composite spacer 66 is used to separate a silicide on the source/drain regions from a silicide on the gate region. In one embodiment, composite spacer 66 is used to offset a high energy high dose implant from the active channel region. In an embodiment of the present invention composite spacer 66 has a thickness in a range from about 500 Å to about 2,000 Å.

Figure 11:
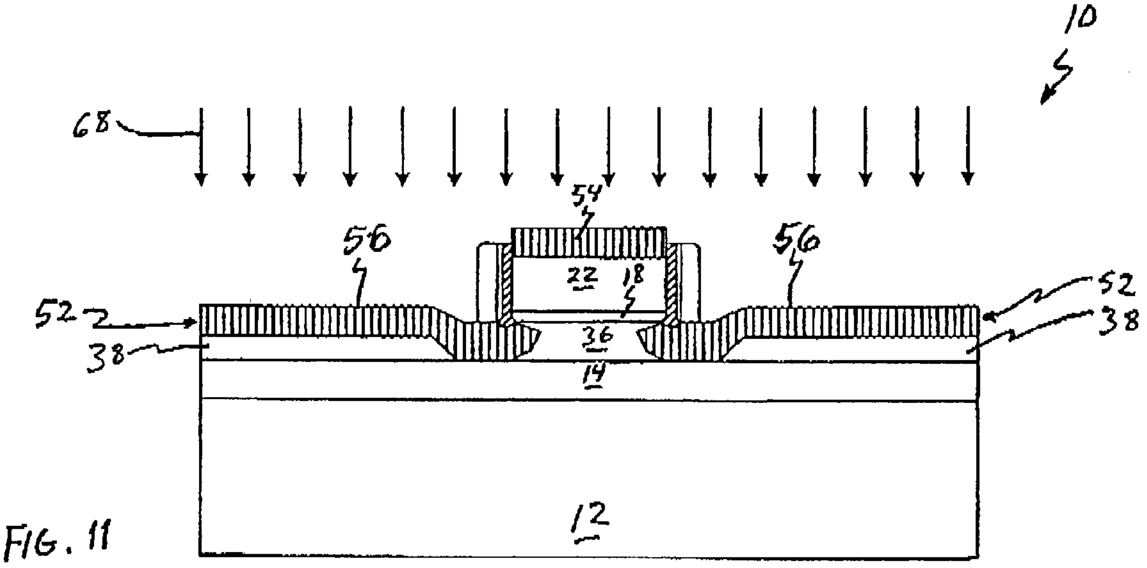
FIG. 11 is an elevational cross-section of the semiconductor structure depicted in FIG. 10 after further processing.

In one process flow embodiment, depicted in FIG. 11, a source/drain implant is made. The source/drain implant 68 is made in the raised epitaxial tip 56 in alignment with the outside edges of composite spacer 66 in order to increase the doping concentration of the source/drain contact regions and the polysilicon layer 54. Spacers 26 and 66 and gate electrode 22 prevent doping of the channel region (the gate-masked residue 36) beneath the gate as well as the ultra-thin body epitaxial film disposed beneath the spacers. Accordingly, the source/drain implant does not affect the ultra-thin body epitaxial SOI film at the embedded source/drain junction 58.

Figure 12:
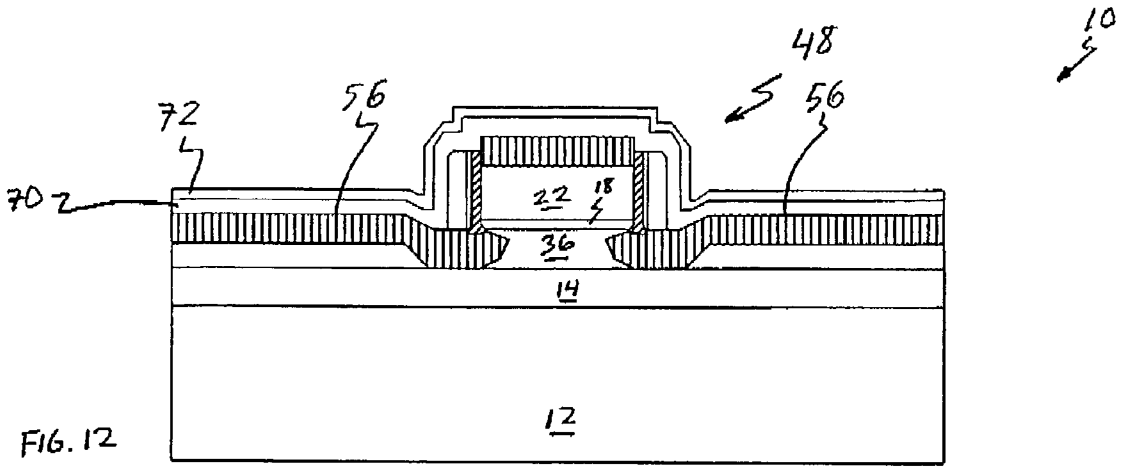
FIG. 12 is an elevational cross-section of the semiconductor structure depicted in FIG. 11 after further processing.

After the optional source/drain implant, a salicidation process is carried out to form a low resistance film for the gate stack 48 above gate electrode 22 and for the elevated raised epitaxial tip 56. In one embodiment, a refractory metal film 70 is blanket deposited over substrate 12 as depicted in FIG. 12. The refractory metal may be selected from nickel (Ni), cobalt (Co), palladium (Pd) and the like. The refractory metal may also be selected from aluminum (Al), titanium (Ti), tungsten (W), ti-tungsten (TiW), chromium (Cr), and the like. Other refractory metals may be selected according to integration with a given process flow and/or a given end product. The refractory metal film 70 is blanket deposited. In an embodiment of the present invention a cobalt film is deposited to a thickness in a range from about 100 Å to about 200 Å. Refractory metal film 70 may be formed by any well known method including sputter deposition such as physical vapor deposition (PVD) or by CVD. An Endura® system, made by Applied Materials (AMAT) of Santa Clara, Calif. can be used to sputter deposit refractory metal film 70.

After the formation of refractory metal film 70, a protective layer 72, of for example titanium nitride, is deposited directly onto refractory metal film 70. In one embodiment, protective layer 72 is titanium nitride that is deposited to a thickness in a range from about 500 Å to about 200 Å. Protective layer 72 can be formed by any well known technique such as by PVD with an Applied Materials Endura system or it can be formed by CVD. Protective layer 72 protects the underlying refractory metal layer 70 from oxidation during a subsequent silicide anneal.

Figure 13:
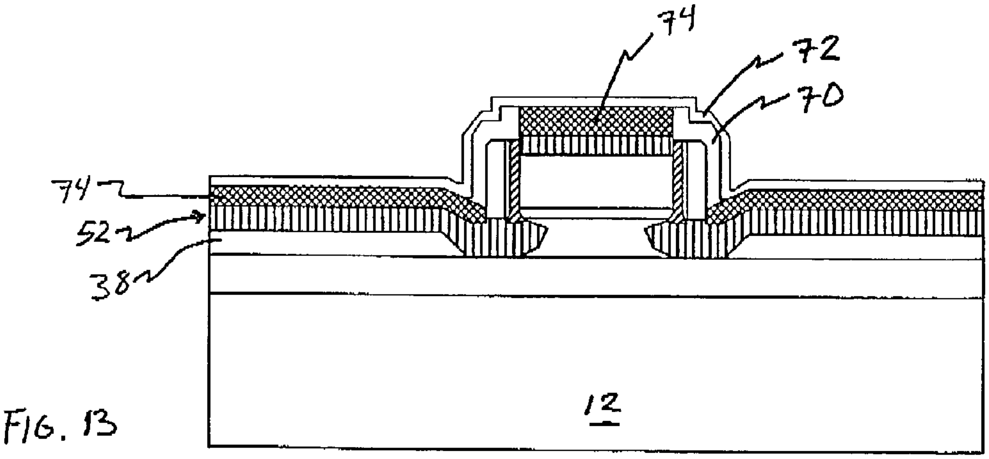
FIG. 13 is an elevational cross-section of the semiconductor structure depicted in FIG. 12 after further processing.

After the formation of protective layer 72, substrate 12 is heated to a temperature and for a period of time sufficient to cause refractory metal film 70 to react with underlying silicon to form a refractory metal silicide film as depicted in FIG. 13. The heating process may be carried out in an inert atmosphere such as argon (Ar) or in some instances, nitrogen ($N_2$) and a temperature in a range from about 400° C. to about 500° C. for a time range from about 45 seconds to about 2 minutes. In one embodiment, heating is carried out at about 450° C for about 90 seconds. Substrate 12 can be suitably annealed in an AMAT 5000® or AMAT 5200® (RTP tool. Such a heating process causes the reaction of the refractory metal film 70 and underlying silicon for form a low sheet-resistance phase film 74 that has a mean sheet resistance of about 11 Ohms per square.

Figure 14:
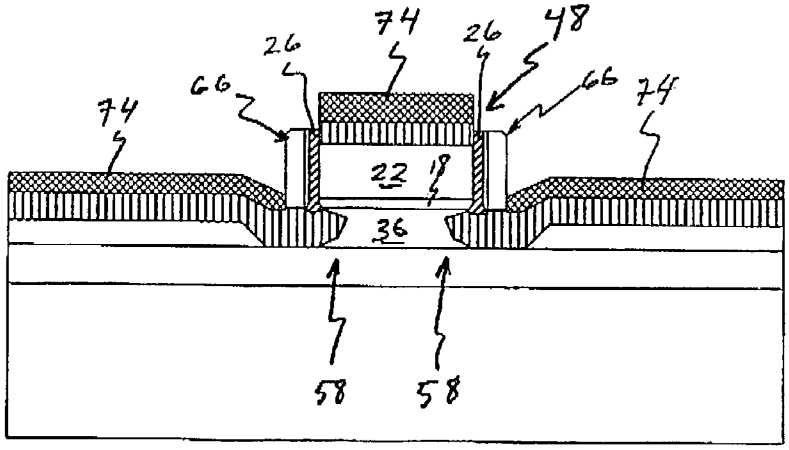
FIG. 14 is an elevational cross-section of the semiconductor structure depicted in FIG. 13 after further processing.

FIG. 14 depicts further processing. Any unsalicided refractory metal film 70 is removed, for example, with a 50:1 buffered HF wet etch for a time period from about 90 seconds to about 150 seconds. After the wet etch, the low sheet-resistance phase film 74 remains on the source/drain regions and on gate stack 48 are electrically isolated from one another by the spacers 26 and 66.

The present invention has been depicted with respect to a p-MOS device having a specific structure. However, it is to be appreciated that the present invention can be used to form an embedded epitaxial junction in an undercut with raised a epitaxial silicon tip and a low resistance refractory metal silicide on an arsenic or phosphorus (n-type) doped film. For example, the process of the present invention can be used to form a low resistance silicide on an n-MOS device formed by the above described process except that the recesses are formed in a p-type substrate region having a conductivity in the range of about $1\times10^{17}/cm^3$ to about $1\times10^{19}/cm^3$ and are filled with the an n-type silicon film having a doping density between about $1\times10^{18}/cm^3$ to about $1\times10^{21}/cm^3$. In one embodiment the concentration is about $1\times10^{20}/cm^3$. For example, an n-type silicon film can be formed by decomposition of dichlorosilane $SiH_2Cl_2$ at a flow rate from about 20 sccm to about 250 sccm and an n-type dopant source of hydrogen-dilutes phosphane $PH_3$ at a flow rate from about 100 sccm to about 400 sccm and at a temperature in a range from about 500° C. to about 700° C. In one embodiment, about 200 sccm dichlorosilane and about 200 sccm phosphane is metered to substrate 12 at about 575° C. As set forth herein, where selectivity is preferred, hydrogen chloride may be metered to substrate at a flow rate from about 5 sccm to about 60 sccm.

Figure 15:
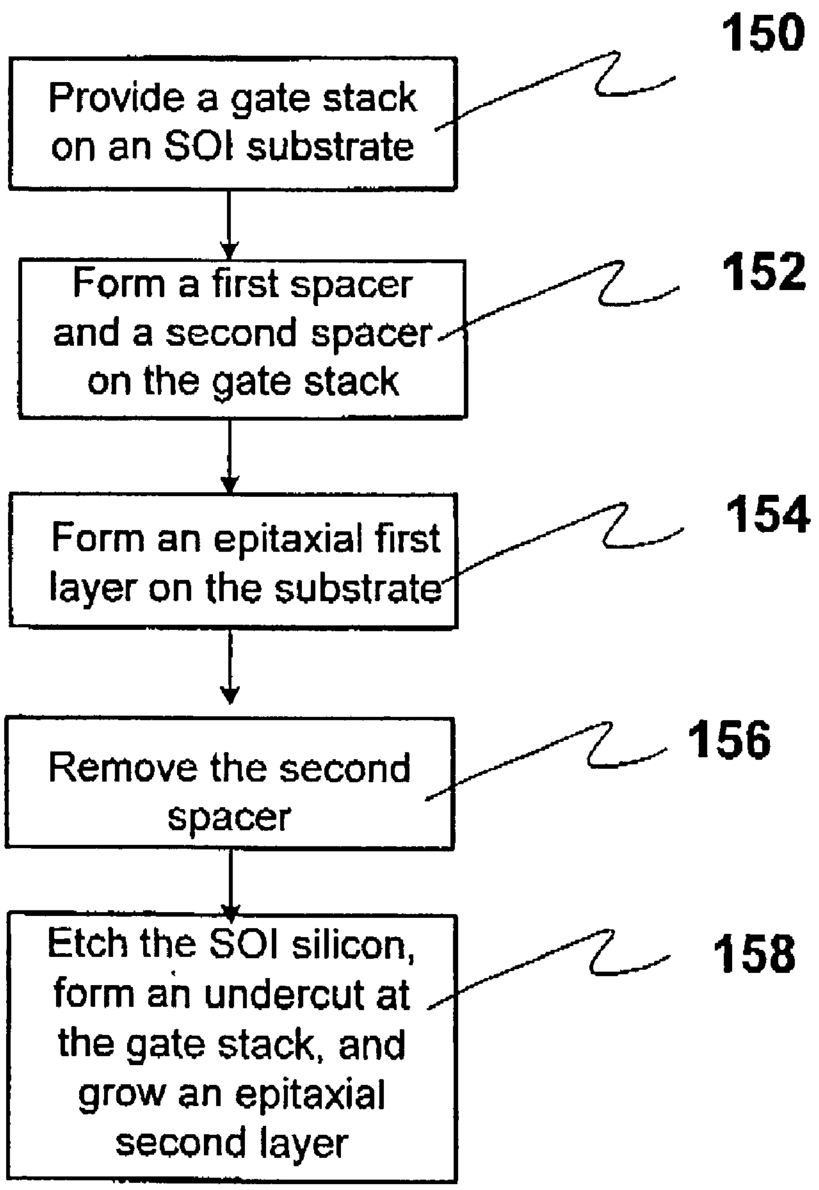
FIG. 15 is a chart that describes a process flow embodiment.

FIG. 15 is a process flow diagram that illustrates a process embodiment. The process begins with providing 150 a gate stack upon a silicon-on-insulator (SOI) substrate. Thereafter, a first spacer and a second spacer are formed 152 on the gate stack. An elevated epitaxial first layer is grown 154 upon the substrate, and the second spacer is removed 156. Thereafter at the gate stack, a gate stack undercut is etched, and a source/drain epitaxial second film is formed 158 at the gate stack undercut.

Figure 16:
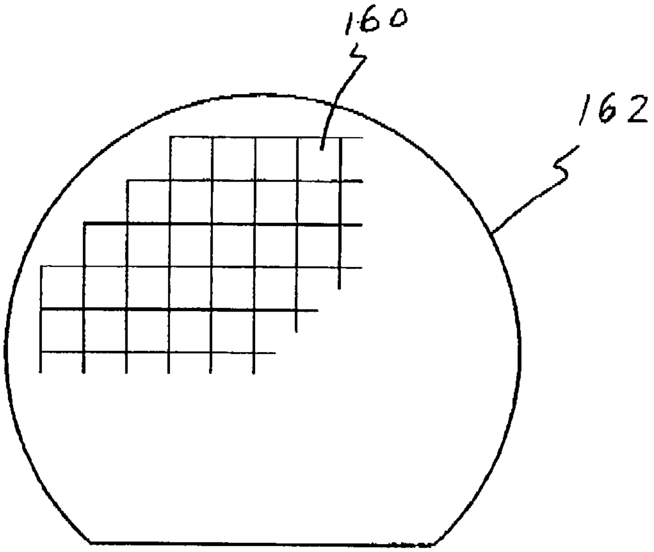
FIG. 16 is a top plan schematic view of a silicon wafer that contains an ultra-thin body SOI device embodiment.

One embodiment of the inventive ultra-thin body SOI device includes an electronic system. With reference to FIG. 16, a semiconductor die 160 may be produced from a semiconductor wafer 162 that contains the MOS device 10. A die 160 is an individual pattern, typically rectangular, on substrate 12 that contains circuitry to perform a specific function. A semiconductor wafer 162 will typically contain a repeated pattern of such dies 160 containing the same functionality. Die 160 may further contain additional circuitry to extend to such complex devices as a monolithic processor with multiple functionality. Die 160 is typically packaged in a protective casing (not shown) with leads extending therefrom such as bump pad layers that provide access to the circuitry of the die 160 for unilateral or bilateral communication and control. In one embodiment, die 160 is encased in a chip package (not shown) such as a chip-scale package (CSP).

Figure 17:
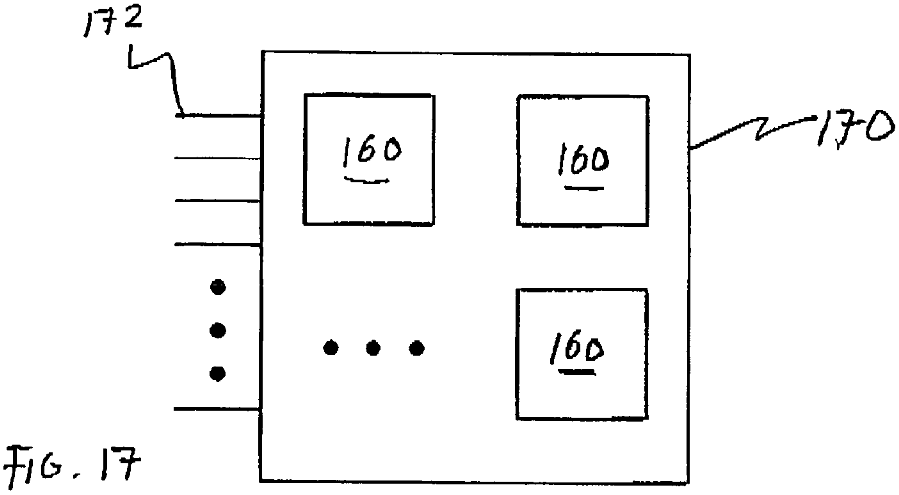
FIG. 17 is a schematic view of a circuit module according to an embodiment.

As shown in FIG. 17 two or more dies 160, one of which including at least one ultra-thin body SOI device as is depicted in FIGS. 1-14 in accordance with the present invention may be combined, with or without protective casing, into a circuit module 170 or chipset to enhance or extend the functionality of an individual die 160. Circuit module 170 may be a combination of dies 160 representing a variety of functions, or a combination of dies 160 containing the same functionality. Some examples of a circuit module 170 include memory modules, device drivers, power modules, communication modems, processor modules and application-specific integrated circuit (ASIC) modules, and may include multilayer, multi-chip modules. Circuit module 170 may be a subcomponent of a variety of electronic systems, such as a clock, a television, a cell phone, a personal computer, an automobile, an industrial control system, an aircraft and others. Circuit module 170 has a variety of leads 172 extending therefrom providing unilateral or bilateral communication and control.

Figure 18:
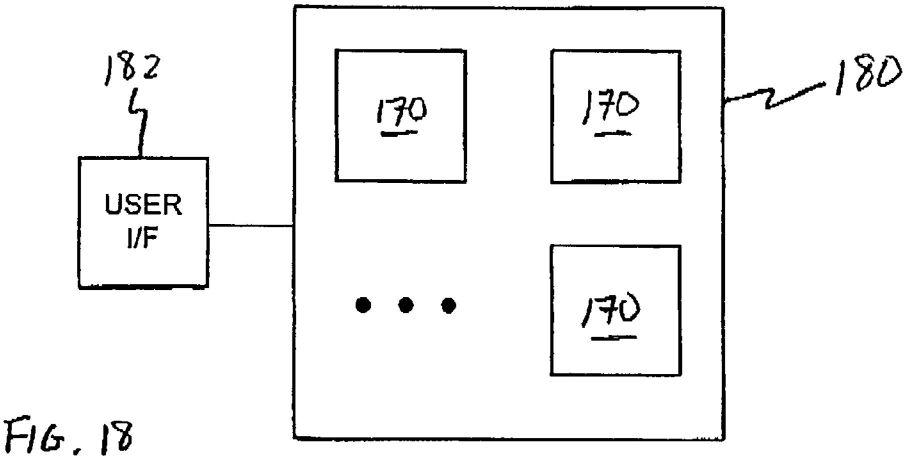
FIG. 18 is a schematic view of an electronic system.

FIG. 18 shows an electronic system 180 containing one or more circuit modules 170 as described above containing at least one instance of the inventive ultra-thin body SOI device 10 as described herein. Electronic system 180 generally contains a user interface 182. User interface 182 provides a user of the electronic system 180 with control or observation of the results of the electronic system 180. Some examples of user interface 182 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 182 may further describe access ports provided to electronic system 180. Access ports are used to connect an electronic system to the more tangible user interface components previously exemplified. One or more of the circuit modules 170 may include a processor providing some form of manipulation, control or direction of inputs from or outputs to user interface 182, or of other information either preprogrammed into, or otherwise provided to, electronic system 180. As will be apparent from the lists of examples previously given, electronic system 180 will often contain certain mechanical components (not shown) in addition to the circuit modules 170 and user interface 182. It will be appreciated that the one or more circuit modules 170 in electronic system 180 can be replaced by a single integrated circuit. Furthermore, electronic system 180 may be a sub-component of a larger electronic system.

Figure 19:
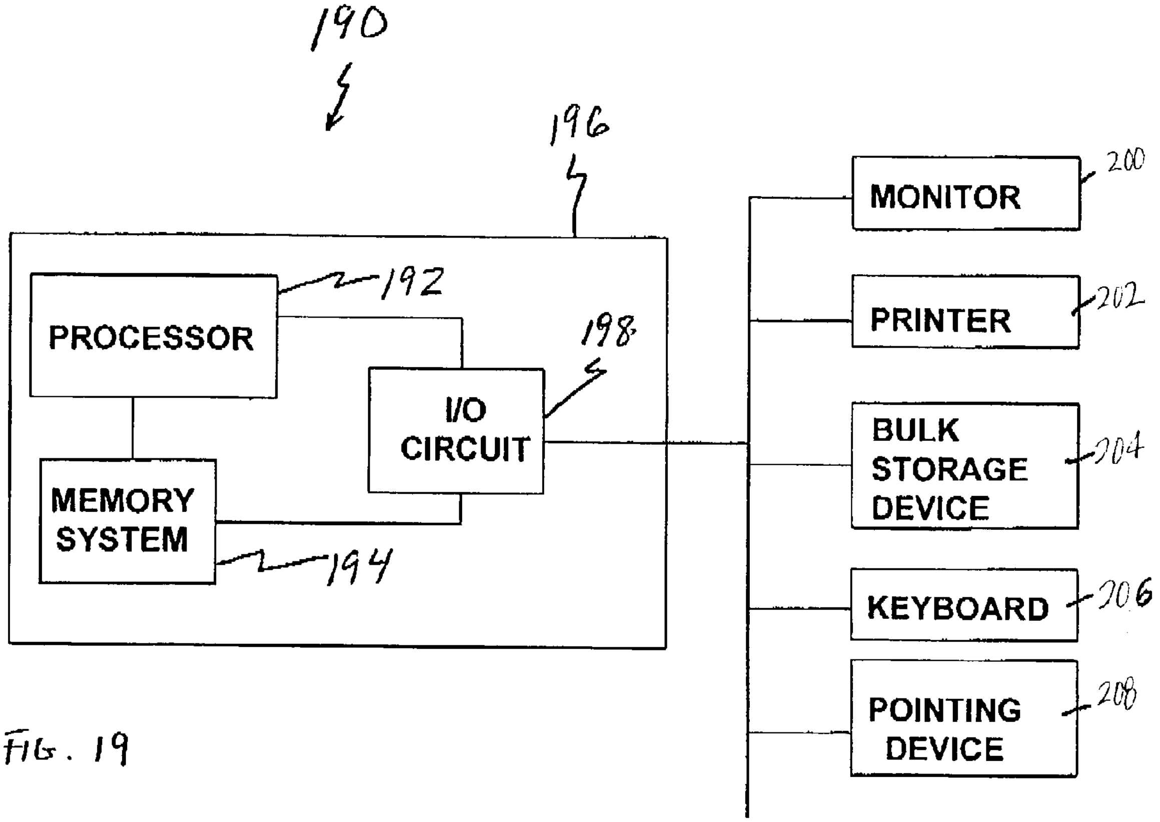
FIG. 19 shows a further embodiment of an electronic system as a computer system.

FIG. 19 shows a further embodiment of an electronic system as a computer system 190. Computer system 190 contains a processor 192 and a memory system 194 housed in a computer unit 196. Computer system 190 is but one example of an electronic system containing another electronic system, i.e. memory system 194, as a sub-component. The computer system 190 may contain an input/output (I/O) circuit 198 that is coupled to the processor 192 and the memory system 194. Computer system 190 optionally contains user interface components that are coupled to the I/O circuit 198. The I/O circuit 198 may be coupled a monitor 200, a printer 202, a bulk storage device 204, a keyboard 206, and a pointing device 208. It will be appreciated that other components are often associated with computer system 190 such as modems, device driver cards, additional storage devices, etc. It will further be appreciated that the processor 192 and/or the memory system 194 may include ultra-thin body SOI devices according to an embodiment. Further, at least two of processor 192, memory system 194, and I/O circuit 198 of computer system 190 can be incorporated on a single integrated circuit. Such single package processing units reduce the communication time between the processor 192 and the memory system 194.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A field effect transistor, comprising:

a gate stack disposed upon an SOI substrate;

a trench formed in a top silicon layer of the SOI substrate, the trench contacting a buried insulator layer and undercutting the gate stack to define a gate-masked silicon channel;

a lateral silicon residue of the top silicon layer adjacent to the trench and opposite the gate-masked silicon channel; and an epitaxial layer disposed in the trench, the epitaxial layer in contact with both the gate-masked silicon channel and the lateral silicon residue.

2. The field effect transistor according to claim 1, wherein the epitaxial layer has a thickness in a range from about 100 Å to about 1,500 Å, and wherein the epitaxial layer is an n-doped layer or a p-doped layer and wherein the epitaxial layer has a top surface with a higher elevation than a top surface of the gate-masked silicon channel.

3. The field effect transistor according to claim 1, wherein the epitaxial layer has a thickness in a range from about 100 Å to about 1,500 Å and further including:

a salicided raised epitaxial tip disposed in the epitaxial layer and adjacent to the gate stack.

4. The field effect transistor according to claim 1, wherein the epitaxial layer has a thickness in a range from about 100 Å to about 1,500 Å, wherein the epitaxial layer is an n-doped layer or a p-doped layer, and further including:

a salicided polysilicon gate layer disposed above and on the gate stack.

5. The field effect transistor according to claim 1, wherein the epitaxial layer has a thickness in a range from about 100 Å to about 1,500 Å, wherein the epitaxial layer is an n-doped layer or a p-doped layer, and further including:

a salicided raised epitaxial tip disposed in the epitaxial layer and adjacent to the gate stack; and a salicided polysilicon gate layer disposed above and on the gate stack.

6. The field effect transistor according to claim 1, wherein the gate stack includes a polysilicon gate electrode with a width, W, and wherein the gate-masked silicon channel includes a channel length less than width, W.

7. The field effect transistor according to claim 1, wherein the gate stack includes a polysilicon gate electrode with a width, W, and wherein the gate-masked silicon channel includes a channel length in a range from about 0.2 W to about 0.99 W.

8. The embedded source/drain silicon-on-oxide (SOI) junction according to claim 1, wherein the epitaxial layer comprises germanium.

9. The embedded source/drain silicon-on-oxide (SOI) junction according to claim 1, further including:

a SOI channel embedded beneath the gate stack, wherein the gate stack includes a metal gate electrode with a width, W, and wherein the SOI channel includes a channel length less than width, W.

10. The field effect transistor of claim 1, wherein the epitaxial layer has substantially the same crystal orientation as the gate-masked silicon channel and the lateral silicon residue.

11. The field effect transistor of claim 1, wherein the epitaxial layer includes a closure seam between the gate-masked silicon channel and the lateral silicon residue and wherein the epitaxial layer substantially covers the buried insulator layer at the bottom of the trench.

* * * * *